United States Patent [19]
Kantz et al.

[11] Patent Number: 4,752,929
[45] Date of Patent: Jun. 21, 1988

[54] METHOD OF OPERATING A SEMICONDUCTOR MEMORY WITH A CAPABILITY OF TESTING, AND AN EVALUATION CIRCUIT FOR PERFORMING THE METHOD

[75] Inventors: Dieter Kantz, München; Günther Kuchinke, Neubiberg, both of Fed. Rep. of Germany

[73] Assignee: Siemens Aktiengesellschaft, Berlin and Munich, Fed. Rep. of Germany

[21] Appl. No.: 843,179

[22] Filed: Mar. 25, 1986

[30] Foreign Application Priority Data

Mar. 26, 1985 [DE] Fed. Rep. of Germany ....... 3510941

[51] Int. Cl.$^4$ .................................... G11C 29/00
[52] U.S. Cl. ......................... 371/21; 371/24; 365/201
[58] Field of Search ............ 371/21, 24, 25, 68; 365/201; 324/73 R, 73 AT

[56] References Cited

U.S. PATENT DOCUMENTS

| | | | |
|---|---|---|---|
| 4,313,199 | 1/1982 | Aichelmann | 371/21 |
| 4,412,327 | 10/1983 | Fox | 371/21 |
| 4,592,052 | 5/1986 | Iwasa | 371/21 |
| 4,601,034 | 7/1986 | Sridhar | 371/25 |

Primary Examiner—Jerry Smith
Assistant Examiner—Robert W. Beausoliel
Attorney, Agent, or Firm—Herbert L. Lerner; Laurence A. Greenberg

[57] ABSTRACT

A method of operating a semiconductor memory with a facility for performing integrated parallel testing, wherein the semiconductor memory is subdivided into n identical cell fields with addressable storage cells, each of the storage cells of each of the cell fields being addressable within a storage cycle simultaneously with, respectively, one storage cell of each of the other cell fields, wherein during a testing operation of the semiconductor memory, the storage cell of one of the n cell fields addressed for the purpose of reading out (read cycle) of a stored test datum has, due to a writing-in process, the same stored test datum as each of the other addressed storage cells addressed in the same read cycle in the case ("go" case) wherein the semiconductor memory is in order, which comprises, within the semiconductor memory, in the testing operation, simultaneously comparing within a read cycle, the test data read out from each of the storage cells addressed within the read cycle of the respective n cell fields, with a reference data signal which is identical with the original test data to be stored; and alternatively in a "go" case, via the semiconductor memory, making available a signal with a first waveform at a semiconductor memory terminal; and in a "no-go" case, via the semiconductor memory, making available a signal with a second waveform at the semiconductor terminal; and evaluation circuit for performing the method.

30 Claims, 5 Drawing Sheets

METHOD OF OPERATING A SEMICONDUCTOR MEMORY WITH A CAPABILITY OF TESTING, AND AN EVALUATION CIRCUIT FOR PERFORMING THE METHOD

The invention relates to a method for operating a semiconductor memory with a capability of integrated parallel testing and, more particularly, to such a semiconductor memory which is subdivided into n identical cell fields with addressable storage cells, each of the storage cells of each of the cell fields being addressable within a storage cycle simultaneously with, respectively, one storage cell of each of the other cell fields wherein, during a testing operation of the semiconductor memory, the storage cell of one of the n cell fields addressed for the purpose of reading out (read cycle) of a stored test datum has, due to a writing-in process, the same stored test data as each of the other addressed storage cells addressed in the same read cycle in the case ("go" case) wherein the semiconductor memory is in order, as well as an evaluation circuit for performing the method.

A method as well as an evaluation circuit of the aforementioned general type is described, for example, in copending application Ser. No. 811,932, filed Dec. 20, 1985 and assigned to the same corporate assignee as that of the instant application. This patent application describes a semiconductor memory in which storage cells contained in the semiconductor memory can be tested in parallel, for the purpose of saving testing time, among other things.

For this purpose, the entire memory region is divided up into n identical cell fields, n being an even number. The value of n is furthermore equal to the number of desired cell fields and depends upon whether, at address inputs, via which the semiconductor memory is addressed, simple address signals, i.e. only so-called X-addresses and Y-addresses, respectively, are applied, or such address signals which contain within a clock period of the semiconductor memory sequentially an X-address as well as a Y-address (address multiplexing). In this case, n can only be a number divisible by four.

Further described is that semiconductor memories can have data interfaces for data input and output more than 1 bit wide. Typical forms of organization for this purpose are data interfaces with a width of m=4, 8 and 9 bits. For operating the semiconductor memory, the following is used per bit of such a data interface:

(1) a first data switch for entering data to be stored on one of n data lines which belongs to the addressed cell field (normal operation "write", test signal inactive), (2) a second data switch for selecting one of the n data lines, on which a read-out storage datum is present (normal operation "read", test signal inactive), (3) a third data switch to be able to transfer in parallel to all connected n data lines, test data to be stored (testing operation "write", test signal active), (4) an evaluation circuit which, during test operation "read", with the stored test data being read out in parallel, checks whether all test data read out in parallel agree with each other and, in dependence thereon, passes-on either one of the read-out expected storage data ("go" case) to its output or the complementary value thereof ("no-go" case), (5) a fourth data switch to make ready, when reading at the data output terminal either the stored datum selected via the second data switch (normal operation "read") or (testing operation "read") the signal generated at the output of the evaluation circuit.

The aforedescribed evaluation circuit and the test procedure described in connection therewith, however, have a disadvantage due to the evaluation circuit proposed in the instant application that, in the testing operation "read", a signal is not always present immediately at the data output terminal in dependence upon an occurring error, i.e. within the storage cycle in which the error has occurred, that signal being recognizable as an error signal by memory. A further disadvantage is that an error which occurs simultaneously in all cell fields is not recognized, so that no signal is generated which can be recognized as an error signal by the automatic tester connected to the semiconductor memory.

It is therefore an object of the invention of the instant application to provide a method of operating a semiconductor memory with a facility for performing integrated parallel testing as well as an evaluation circuit suitable for performing this method, which avoids the foregoing disadvantages.

With the foregoing and other objects in view, there is provided, in accordance with the invention, a method of operating a semiconductor memory with a facility for performing integrated parallel testing, wherein the semiconductor memory is subdivided into n identical cell fields with addressable storage cells, each of the storage cells of each of the cell fields being addressable within a storage cycle simultaneously with, respectively, one storage cell of each of the other cell fields, wherein during a testing operation of the semiconductor memory, the storage cell of one of the n cell fields addressed for the purpose of reading out (read cycle) of a stored test datum has, due to a writing-in process, the same stored test datum as each of the other addressed storage cells addressed in the same read cycle in the case ("go" case) wherein the semiconductor memory is in order, which comprises, within the semiconductor memory, in the testing operation, simultaneously comparing within a read cycle, the test data read out from each of the storage cells addressed within the read cycle of the respective n cell fields, with a reference data signal which is identical with the original test data to be stored: and alternatively in a "go" case, via the semiconductor memory, making available a signal with a first waveform at a semiconductor memory terminal; and in a "no-go" case, via the semiconductor memory, making available a signal with a second waveform at the semiconductor terminal.

In accordance with another mode of the invention there is provided a method which includes performing the comparison of the read-out test data in an evaluation circuit arrangement within the semiconductor memory and having an output, and further includes applying an output signal to the output of the evaluation circuit.

In accordance with an added mode of the invention there is provided a method which comprises electronically connecting the output of the evaluation circuit to the semiconductor terminal having the signal with the first and the second waveform, respectively, so that the output signal of the evaluation circuit is the same as the signal with the first and second waveform, respectively.

In accordance with an additional mode of the invention, there is provided a method which includes deriving the reference data signal from a signal made available to the semiconductor memory at a terminal contact by an automatic tester.

In accordance with a further mode of the invention, there is provided a method, wherein the terminal contact is a data input terminal.

In accordance with again an additional mode of the invention, there is provided a method which includes using the signal made available by the automatic tester also during read cycles in the testing operation.

In accordance with again an added mode of the invention, there is provided a method which includes generating the reference data signal in a test buffer by using a read signal from the signal made available by the automatic tester to the semiconductor memory.

In accordance with again another mode of the invention, there is provided a method, wherein the read signal is a signal complementary to a write/read standby signal present in the semiconductor memory.

In accordance with again a further feature of the invention, there is provided a method, wherein the signal made available by the automatic tester corresponds per read cycle to the test data which is to be stored originally during a write cycle into the semiconductor memory, and is to be read out in the read cycle.

In accordance with yet an additional mode of the invention, there is provided a method, wherein the semiconductor memory terminal for the signal which is made available is a data output terminal at which information read out in a read cycle in the normal operation of the semiconductor memory is applied.

In accordance with yet an added mode of the invention, there is provided a method, wherein the reference data signal is used as the signal with the first waveform made available at the semiconductor memory terminal, the reference data signal being identical with the read-out test data and the originally stored test data.

In accordance with yet another mode of the invention, there is provided a method, wherein the signal with the first waveform made available at the semiconductor memory terminal is a signal with the constant value logical "1".

In accordance with yet a further mode of the invention, there is provided a method, wherein the signal with the first waveform made available at the semiconductor memory terminal is a signal with the constant value logical "0".

In accordance with still another mode of the invention, there is provided a method, wherein the signal with the second waveform, is complementary to the signal with the first waveform.

In accordance with still an added mode of the invention, there is provided a method, which comprises activating the evaluation circuit only in the testing operation by applying an activated test signal.

In accordance with another aspect of the invention, there is provided, an evaluation circuit for performing a method of operating a semiconductor memory with a capability of integrated parallel testing, comprising a first comparator circuit having n valency circuits each with a first input, a second input and an output, all of the first inputs of the valency circuits being tied together and forming an input for a reference data signal, the second input of each of the valency circuits being connected to a respective one of n data lines, the output of each of the n valency circuits simultaneously forming a respective one of n inputs of a second comparator circuit, the second comparator circuit comprising a device for checking whether all of the n inputs therein have a first logical level, the second comparator circuit having a first output for an error signal (F) which, in a case wherein all of the n inputs thereof have the first logical level, is deactivated, and otherwise is activated, and the second comparator circuit having a second output for signal complementary to the error signal, the evaluation circuit also comprising a result circuit with an output for an output signal of the evaluation circuit which, in a "go" case wherein the semiconductor memory is in order, is available as a signal with a first waveform at a semiconductor terminal and, in a "no-go" case wherein the semiconductor is not in order, assigned with a second waveform is available at the semiconductor terminal, the result circuit comprising, in addition, a first and a second input which are connected to the first and the second outputs of the second comparison circuit, as well as a third input.

In accordance with an added feature of the invention, each valency circuit is an XNOR gate.

In accordance with an additional feature of the invention, each valency circuit is an XOR gate.

In accordance with a further feature of the invention, the second comparator circuit contains a NAND gate with n inputs and one output, the one output being the first output of the second comparator circuit.

In accordance with still another feature of the invention, the second comparator circuit contains an AND gate with n inputs and one output, the one output being the first output of the second comparator circuit.

In accordance with still an added feature of the invention, the second comparator circuit contains an inverter having an input, which is connected to the first output of the second comparator circuit, and having an output which forms the second output of the second comparator circuit.

In accordance with still a further feature of the invention, the result circuit comprises two transistors and an inverter, the inverter being connected output-wise to a terminal of a conduction path of one of the transistors; another terminal of the conduction path of the one transistor forming the output of the result circuit, the one transistor being connected gatewise as the first input of the result circuit to the first output of the second comparator circuit.

In accordance with again another feature of the invention, the other of the transistors of the result circuit has a conduction path by which it is connected to and between the third input of the result circuit and the output of the result circuit, the other transistor being connected gate-wise, as the second input of the result circuit to the second output of the second comparator circuit.

In accordance with still an additional feature of the invention, the inverter of the result circuit is connected input-wise to the third input of the result circuit.

In accordance with still a further feature of the invention, the third input of the result circuit is connected to a source of the reference data signal.

In accordance with again another feature of the invention, the third input of the result circuit is connected to a fixed potential corresponding to a logical "1".

In accordance with again an added feature of the invention, the third input of the result circuit is connected to a fixed potential corresponding to a logical "0".

In accordance with again an additional feature of the invention, there is provided a test buffer for generating the reference data signal, the test buffer having means for receiving information present at the input side of the test buffer with the aid of an activated read signal during a read cycle memory, and making it available as a reference data signal at the output side of the first comparison circuit and the result circuit.

In accordance with yet again another feature of the invention, the information present at the input side of the test buffer is a signal which is present at a data input terminal connected to the test buffer and is identical within the read cycle with test data which are to be read out of the semiconductor memory.

In accordance with yet a further feature of the invention, the read signal is activatible during a read cycle and is derivable by complementation from a read/write standby signal present in the semiconductor memory.

In accordance with yet an additional feature of the invention, a write signal is activatable during a write cycle and is derivable from the write/read standby signal present in the semiconductor memory.

In accordance with a concomitant feature of the invention, the first and the second comparator circuits are activatable only in the testing case by a test signal.

The idea upon which the invention of the instant application is based contains the following considerations: When testing a conventional semiconductor memory, using the parallel testing facility integrated in the semiconductor memory by means of the method described in the aforementioned co-pending application Ser. No. 811,932, no true comparison of the test data read out from the storage cells is made with the expected data, but only a plausibility check is performed internally to the memory. This applies to an even greater extent to the method which is described in co-pending application Ser. No. 811,886, also filed on Dec. 20, 1985 and assigned to the same corporate assignee as that of the instant application wherein an even simpler plausibility check is performed.

A true and clear comparison of the test data read out from the storage cells with the data expected by the automatic tester, while maintaining the parallel testing operation, is possible, however, if the comparison is not made in the automatic tester (a comparison in the automatic tester means abandoning the use of the parallel test facility), but rather, in the semiconductor memory (test piece) to be tested per se. For this purpose it is necessary to make available to the test piece the data expected by the automatic tester (reference information). A suitable evaluation circuit must furthermore be provided within the test piece which compares each read-out test datum with the reference information and makes available to the automatic tester at a terminal of the semiconductor memory a corresponding signal which is a result of the test. With such a method according to the invention and a corresponding evaluation circuit advantageously constructed within the semiconductor memory, it is then possible to test clearly several storage cells in parallel within a single read cycle without having to tolerate the aforedescribed disadvantages.

Other features which are considered as characteristic for the invention are set forth in the appended claims.

Although the invention is illustrated and described herein as embodied in a method of operating a semiconductor memory with a capability of integrated parallel testing, and an evaluation circuit for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, in which.

Figure 1:
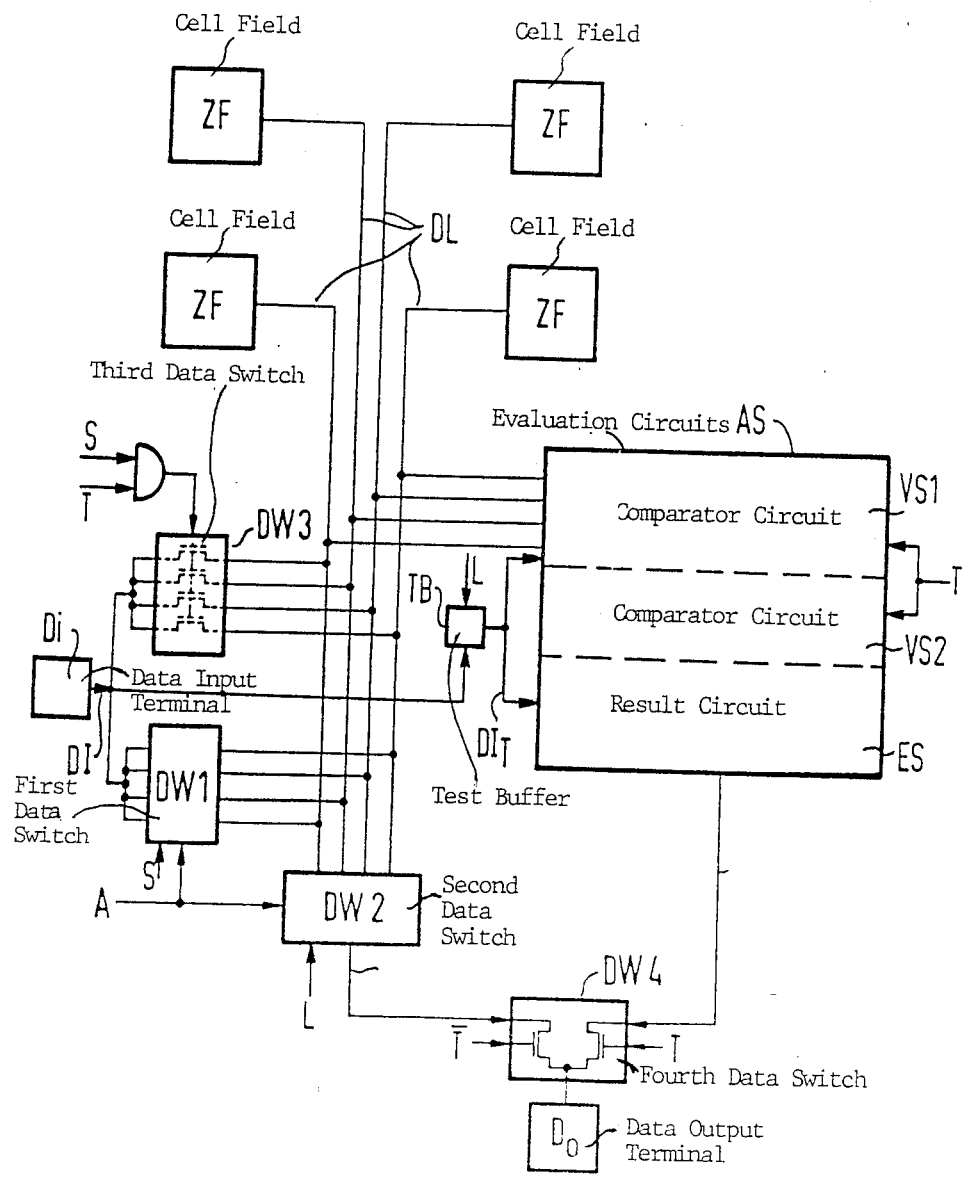
FIG. 1 is a circuit diagram of an evaluation circuit according to the invention tied into a conventional semiconductor memory in the place of a conventional evaluation circuit.

Referring now to the drawing and first, particularly, to FIG. 1 thereof, there is shown a semiconductor memory with $m=1$ data input terminal $D_i$ and $m=1$ data output terminal $D_o$ which contains $n=4$ identical cell fields ZF with memory cells (for example, in a "megabit" memory: total number of storage cells: $1024k \times 1$ bit $= 1M \times 1$ bit: with $n=4$, this makes four cell fields ZF @$256k \times 1$ bit). One of n data lines DL is connected to each cell field ZF. These data lines DL serve for writing information into the memory cells of the cell fields ZF and for reading them out.

In conventional manner, these $n=4$ data lines DL are connected via a first data switch DW1 to the data input terminal $D_i$. During "normal operation write", the data input information DI present at the data input terminal $D_i$ is switched to one of the $n=4$ data lines DL provided for writing information into the memory by addressing the first data switch DW1 by means of definite address information, namely, an addressing signal A, which is present at the most significant $(A_x)$ of existing address terminals, as well as by means of a write signal S, the data input information DI being then written from the respective data line DL into a storage or memory cell of the corresponding cell field ZF.

Correspondingly, for "normal operation read", the data lines DL are connected via a second data switch DW2 to the data output terminal $D_o$. This switch is controlled address-wise in the same manner as is the first data switch DW1. In dependence on a read signal L, the second data switch DW2 switches one of the n data lines DL to the data output terminal $D_o$.

The semiconductor memory according to FIG. 1, furthermore, for a "test operation write", contains a third data switch DW3 which is connected in parallel with the first data switch DW1 and by means of which data input information DI present at the data input terminal $D_i$ is transferred simultaneously to all $n=4$ data lines DL. The third data switch DW3 can contain, for example, $n=4$ parallel-connected transistors each having one side of the conduction paths thereof tied together and to the data input terminal $D_i$, while the other sides of the conduction paths of those transistors are connected to a respective data line DL. The transistors of the third data switch DW3 are addressed gate-wise by a control signal which is generated, for example, by means of an AND gate, from the write signal S and the test signal T. If test data are written via this third data switch DW3 into the storage cells of the cell fields ZF, the corresponding parallel-addressed storage or memory cells of the cell fields ZF contains amongst one another the same information, as long as the semiconductor memory is in order.

If each of the cell fields ZF, during testing operation, is considered as a memory by itself (test piece), the test data, which must be matched address-wise to the number of storage cells of a cell field ZF, can be written simultaneously in parallel into all of the cell fields ZF.

The test signal T which activates the third data switch DW3 can be obtained in different ways. In a first advantageous embodiment according to FIG. 6, a signal in the form of a constant potential (for example, a logical "one") is applied in a test case and is stabilized via an amplifier V. In normal operation, either a constant potential, for example, with the value logical "0", is applied or the terminal TP remains unoccupied. In the latter case, it is advisable to connect the terminal TP via a high resistance to a potential ($V_{SS}$) which corresponds to a logical "0". The thus generated test signal T which can be taken off at the amplifier V, for example, together with the write signal S, then addresses the gates of the third data switch DW3, so that the transistors thereof conduct. At an inverted output of the amplifier V, an inverted signal $\overline{T}$ is then generated accordingly. This solution has the advantage, on the one hand, that a potential can be selected for the test signal T which is otherwise used also for addressing the semiconductor memory (for example, "TTL level"). On the other hand, however, an additional terminal is required for the terminal TP but may not be available under certain circumstances, for example, because of housing dimensions of the semiconductor memory.

Figure 5:
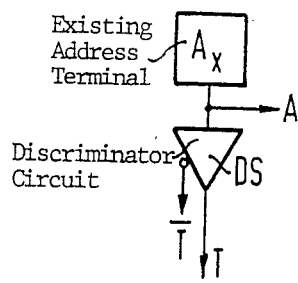
FIGS. 5 and 6 are circuit diagrams of possible embodiments for generating a test signal.

In another advantageous embodiment, shown in FIG. 5, a connection is concurrently used which is used otherwise for normal operation. As a most suitable connection, there is proposed a connection which serves for controlling the semiconductor memory by means of address information, particularly the information for the most significant X or Y or X/Y information (with the currently conventional address multiplex method). In normal operation, a (most significant) addressing signal A with a "0" level of 0 volts and a "1" level of 5 volts is applied to such a terminal with currently conventional semiconductor memories. In FIG. 5, this connection is generally identified by reference character $A_x$. In normal operation, the most significant X/Y address information is applied thereto. For testing operation, however, a potential is applied which, for example, is distinctly above the "1" level of the conventional addressing signal A present at the address terminal $A_x$, for example, 10 volts. A post-connected discriminator circuit DS recognizes this applied potential and generates a test signal T internal to the semiconductor memory. Discriminator circuits DS are known per se, for example, in the form of threshold switches. Conventional threshold switches can be seen, for example, in German Published Non-Prosecuted Application (DE-OS) Nos. 30 30 852 and 33 18 564. Moreover, other embodiments in the current state of the art are also conceivable.

The semiconductor memory furthermore contains m identical evaluation circuits AS according to the invention (m = the width of the data interfaces for data input and output).

It is the purpose of each of these evaluation circuits AS to take over, in test operation "read" (test signal T is active, the write signal S is inactive and the read signal L is active) during the reading-out from the semiconductor memory of the information present on the n data lines DL associated with the respective evaluation circuit AS and in the case where all this information is equal ("go" case) to a reference data signal $DI_T$, to make available as the output signal $AUS_{Test}$, a signal with a first waveform at a semiconductor memory terminal $D_o$ and PA, respectively, and, in the case when at least one of these pieces of information is not equal to the reference data signal $DI_{Test}$ ("error" case), and to make available as the output signal $AUS_{Test}$, a signal with a second waveform at the semiconductor memory terminal $D_o$ or PA. In an advantageous further embodiment of the invention, the signal with the second waveform is complementary to that with the first waveform.

It can therefore be summarized as follows: according to FIG. 1, the semiconductor memory with a data interface m = 1 and with the evaluation circuit AS according to the invention contains n = 4 identical cell fields ZF. For the data input and output, a respective data line DL is assigned to each cell field ZF.

In normal operation "write" of the semiconductor memory (test signal T inactive, write signal S active, read signal L inactive), a piece of data input information DI which is present at a data input terminal $D_i$ associated with the cell fields ZF and which is to be stored (=written) in a storage or memory cell of one of the cell fields ZF is switched per write cycle, via a first data switch DW1 as a function of addressing data A, the test signal T and the write signal S, to one of the data lines DL and stored in an addressed storage or memory cell of the cell field ZF in question.

In normal operation "read" (test signal T inactive, write signal S inactive, read signal L active), data output information to be read out from a storage cell of a cell field ZF is made available via the data line DL associated with the addressed cell field ZF to a second data switch DW2 and, likewise in dependence upon addressing data A, is selected by the latter and passed on as read data $AUS_{Norm}$.

In testing operation "write" of the semiconductor memory (test signal T active, write signal S active, read signal L inactive), the data input information DI to be stored, which is present at the data input terminal $D_i$ and is intended to be a test datum, is stored per write cycle via a third data switch DW3 in an addressed storage or memory cell of each of the n cell fields ZF parallel via all n data lines DL.

In the test operation "read" (test signal T active, write signal S inactive, read signal L active), the test data are fed via all n data lines DL to the evaluation circuit AS per read cycle, which occurs in parallel, for reading out the stored test data from the n cell fields ZF. The evaluation circuit AS has an output with an output signal $AUS_{Test}$. Within the evaluation circuit AS which, of course, is located within the semiconductor memory, the test data present on the n data lines DL, which are designed as n parallel inputs for the evaluation circuit AS and are read out from the currently addressed storage cells, are compared during each read cycle simultaneously and in parallel with a reference data signal $DI_T$, the generation of which will be described hereinafter. The reference data signal $DI_T$ is fed to the evaluation circuit AS via a further input. It is identical for each storage cell with the test data which have been written into the storage cells just then addressed during the current read cycle in the test operation "write". It is generated in a manner yet to be described and applied to the evaluation circuit AS.

Depending upon the form of the evaluation circuit AS, the reference data signal $DI_T$ which, in the instant "go" case, is identical with the test data read out in parallel and the originally stored test data is used as the output signal $AUS_{Test}$ of the evaluation circuit AS which can be applied as a signal with the first waveform, in the case in which all comparisons per read cycle turn out positive ("go" case), through the semiconductor memory to a semiconductor terminal $D_o$ or PA. In this case, however, a constant logical "0" or "1" can also be generated.

Accordingly, in the case wherein at least one of the comparisons turn out negative ("no-go" case), the output signal $AUS_{Test}$ of the evaluation circuit AS can be interpreted so that it is applied as a signal with a second waveform to the semiconductor terminal $D_o$ or PA. This second waveform is advantageously complementary to the first waveform. In accordance with the foregoing cases with respect to the signal with the first waveform, it is therefore either complementary to the reference data signal $DI_T$ or it is constant at a logical "1" and logical "0", respectively.

With an appropriate design of the hardware and/or the software of an automatic tester connected, among other things, to the semiconductor terminal $D_o$ or PA, it is therefore recognizable to the automatic tester in each read cycle as to how the parallel test internal to the semiconductor memory has turned out.

Figure 10:
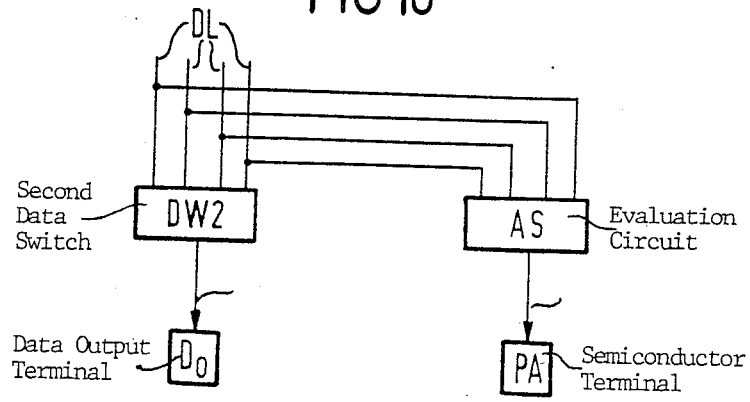
FIG. 10 is a circuit diagram of a separate semiconductor memory terminal for the output signal of the evaluation circuit.

Depending upon the construction of the conventional semiconductor memory, the output signals $AUS_{Norm}$ and $AUS_{Test}$ are applied either via a fourth data DW4 as a function of the test signal T and a signal $\overline{T}$ complementary thereto, alternatively, to a semiconductor terminal constructed as the data output terminal $D_o$ (see FIG. 1) or, per output signal $AUS_{Norm}$, $AUS_{Test}$, via a data output terminal $D_o$ and the test terminal PA, respectively, assigned to the second data switch DW2 and the evaluation circuit AS, respectively (see FIG. 10).

Figure 6:
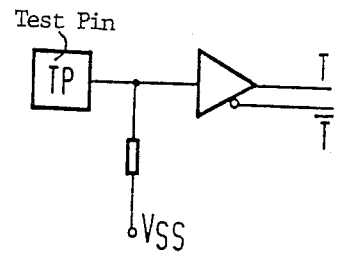

The test signal T and its complementary signal $\overline{T}$ can be generated, as is well known, for example, by means of a discriminator circuit DS (FIG. 5). A separate semiconductor terminal can also be used, however, as a test pin TP (FIG. 6).

Figure 7:
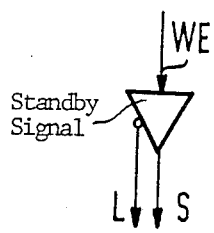
FIG. 7 is a circuit diagram of a device for generating a write and read signal in accordance with the invention.

According to FIG. 7, a write/read standby signal WE which is available, in any case, in the semiconductor memory is advantageously used as the write signal S, with the employment of an amplifier V. The read signal L can be taken off at an inverted output of the amplifier V.

Figure 2:
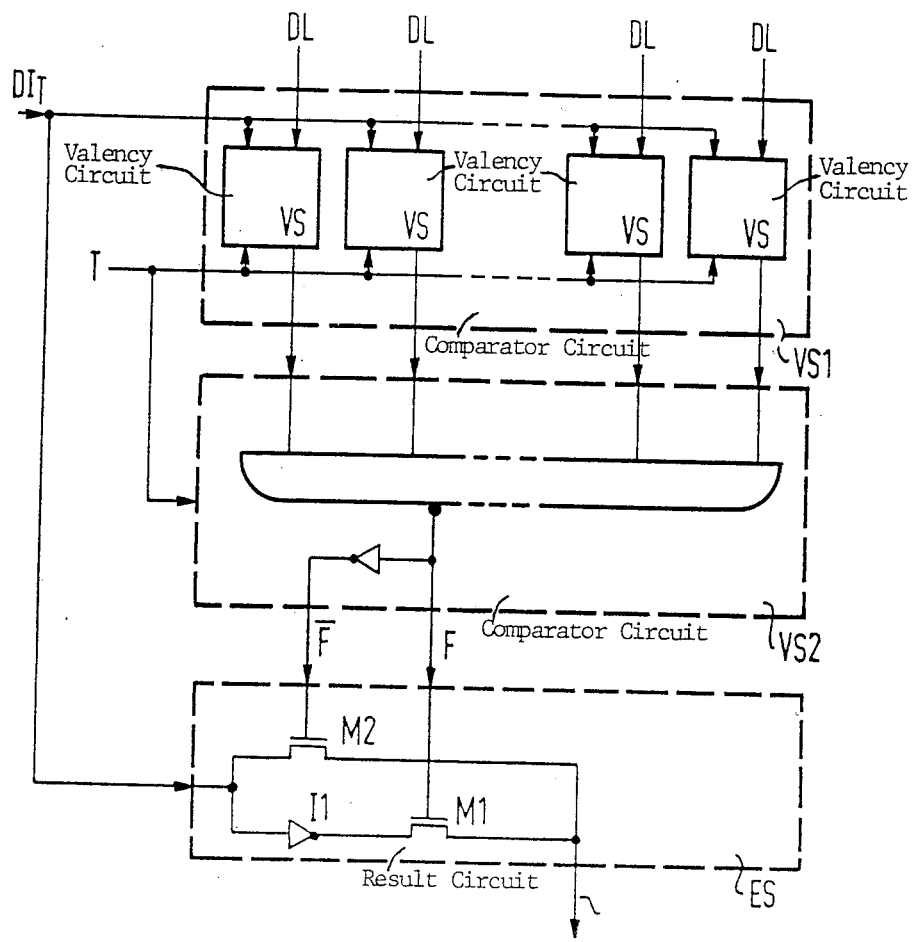
FIGS. 2 to 4 are fragmentary circuit diagrams of FIG. 1 showing various advantageous embodiments of the evaluation circuit in further detail.
Figure 8:
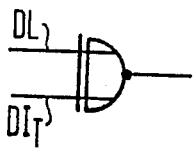
FIGS. 8 and 9 are logic circuit diagrams of two advantageous embodiments of a valency circuit forming part of the invention.

The evaluation circuit AS according to the invention which is to be used with the advantageous method contains, according to FIGS. 1 and 2, primarily three circuit sections: two comparator circuits VS1 and VS2 and a result circuit ES. The first (VS1) of the comparator circuits contains primarily a valency circuit VS for each data line DL, respectively, connected to the input. Each valency circuit VS has two inputs. The first of these inputs of the valency circuits VS are all acted upon together by the reference data signal $DI_T$. It is generated in a test buffer TB using the read signal L. For this purpose, a signal DI which is present at the data input terminal $D_i$ and is identical with the originally stored test data per read cycle is applied to the test buffer. The second input of each valency circuit VS, respectively, is connected to one of the data lines DL. In a special embodiment according to FIG. 8, each valency circuit VS is formed by an XNOR gate. Its output is active if both inputs have the same logic level. This is the case if the test data read out to the respective data line DL is equal to the reference data signal $DI_T$, which, of course, is equal, in turn, to the originally stored test data. In the "no-go" case (a read-out test datum on at least one of the data lines DL is unequal to the reference data signal $DI_T$), the output is inactive.

Figure 9:
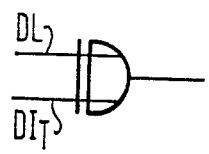

In an advantageous manner, each valency circuit VS can also be realized as an XOR gate as is shown in FIG. 9. The output thereof is then correspondingly active in the case of an error or "no-go".

The second comparator circuit VS2 contains, according to FIG. 2, primarily a NAND gate and an inverter. The NAND gate encompasses n inputs, of which each is connected to the output of one of the n valency circuits VS of the first comparator circuit VS1. A first output, for one, contains an error signal $\overline{F}$ and is connected, as a first input, to the result circuit ES. For another, the first output forms the input of the inverter. The output of the latter which is constructed as a second output of the second comparator circuit VS2, contains a signal F complementary to the error signal F. The inverter output is connected to a second input of the result circuit ES. The second comparator circuit VS2 is thus the embodiment of a device for checking whether all the n inputs thereof have a first logic level.

Figure 3:
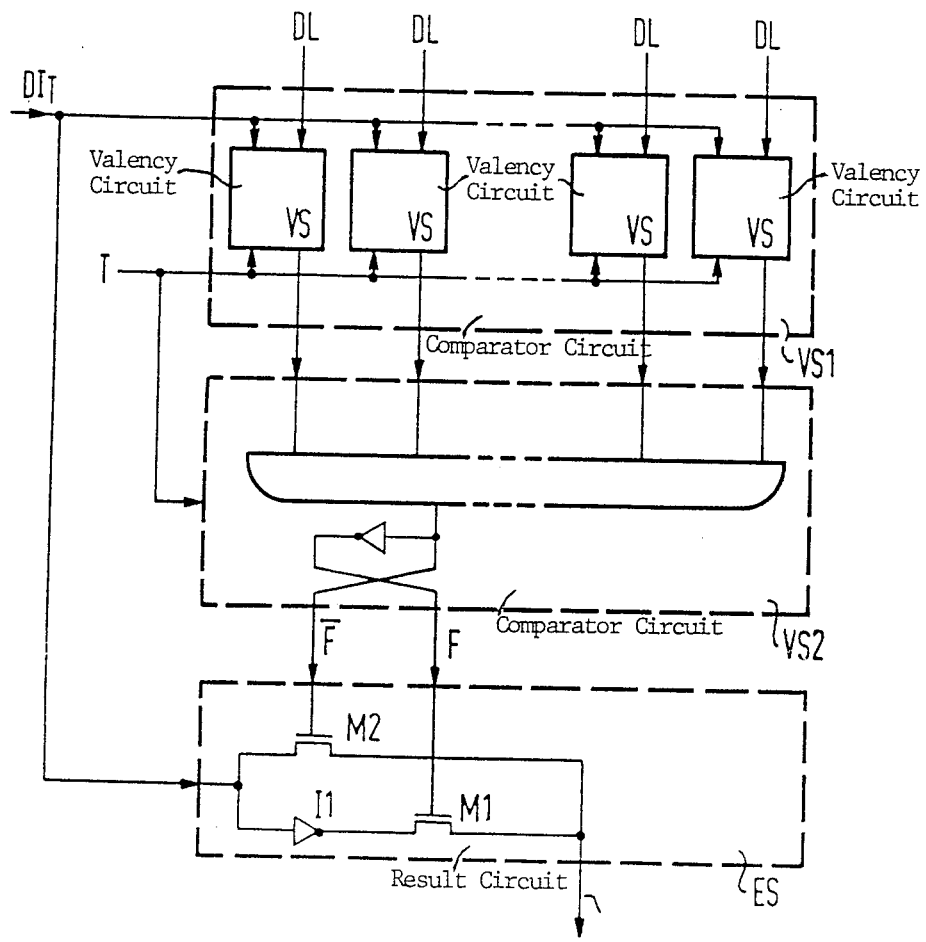

In the embodiment of the evaluation circuit AS shown in FIG. 3, an AND gate is used in the second comparison circuit VS2 instead of the NAND gated. If XNOR gates are used as the valency circuits VS, this requires that the output of this AND gate be brought directly to the second input of the result circuit ES, as well as that it form the input of the inverter. The output of the latter, in turn, is transmitted as an error signal F to the first input of the result circuit ES. Further possible embodiments of combinations of the different described constructions of valency circuits VS with different constructions of second comparison circuits VS2 are possible and are familiar to one skilled in the art.

The result circuit ES also has a third input which, in an embodiment according to FIG. 2, is acted upon by the reference data signal $DI_T$, as well as an output which simultaneously forms the output of the evaluation circuit AS with the output signal $AUS_{Test}$. The result circuit ES contains two transistors M1 and M2 and an inverter I1, which is connected between the third input of the result circuit ES and the conduction path of the first (M1) of the two transistors M1 and M2. Connected in parallel with this series circuit of the inverter I1 and the first transistor M1 is the second transistor M2, the gate of which is connected to the second input of the result circuit ES. The gate of the first transistor M1 is connected to the first input of the result circuit ES.

In this construction of the result circuit ES, the reference data signal $DI_T$ is thus present, in test operation "read", at the data output terminal $D_o$ and the test terminal TA, respectively, in the "go" case, as a signal with a first waveform which, of course, is identical with the test data stored in the test operation "write" and the test data read out in test operation "read". In the "no-go" case, a signal complementary to the reference data signal $DI_T$ is generated as the signal with a second waveform.

Figure 4:
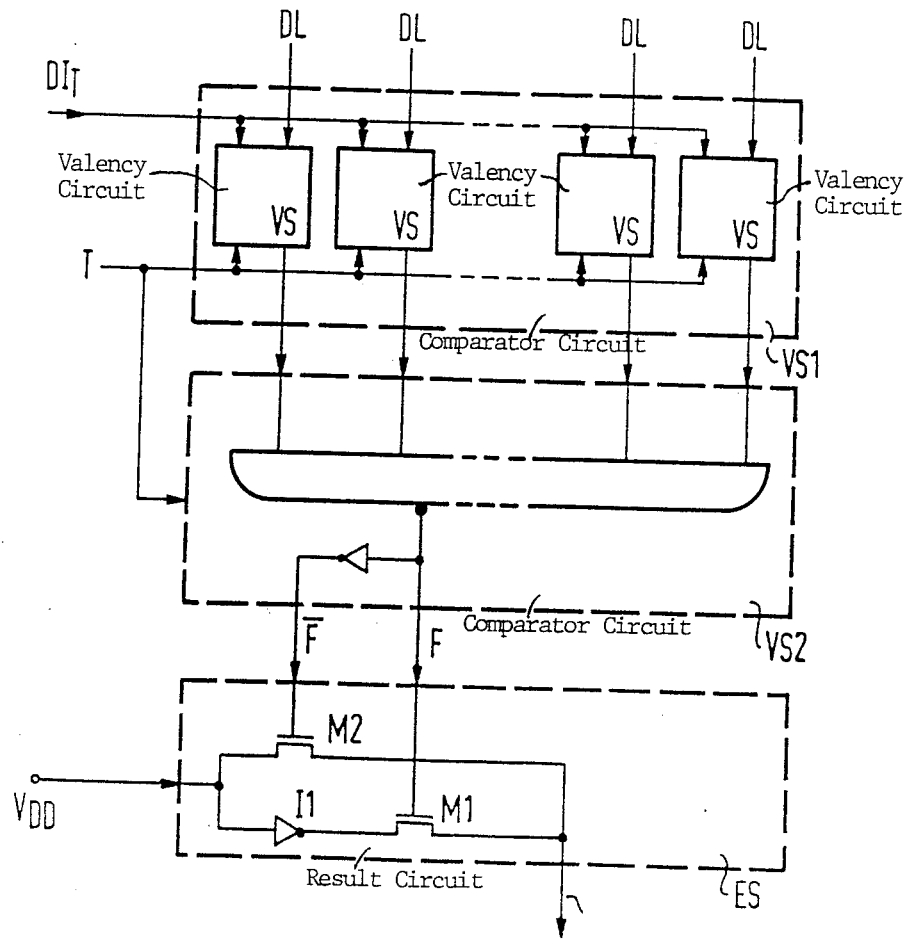

FIG. 4 shows an advantageous embodiment of the result circuit ES in which the third input thereof is permanently wired to logical "1", represented as the supply voltage $V_{DD}$. Accordingly, a logical "1" is present at the data output terminal $D_o$ and the test terminal PA, respectively, in the "go" case, independently of the respectively written-in and read-out test data and the reference data signal $DI_T$. Correspondingly, a logical "0" is present in the no-go case.

A further possible embodiment for the result circuit ES, which is not shown because it is analogous to the embodiment according to FIG. 4, has the third input thereof permanently connected to logical "0" which permits a logical "0" to be generated at the data output terminal $D_o$ and the test terminal PA, respectively, in the "go" case, and a logical "1", in the "no-go" case.

Corresponding embodiments, which are the inverse of the described embodiments of the result circuit ES with respect to the arrangement of the two transistors M1 and M2 and the inverter I1, are, of course, conceivable by a person of ordinary skill in the art and are within the scope of this invention.

It is also within the scope of this invention that the two comparator circuits VS1 and VS2 and/or the reference data signal $DI_T$ become activated only if the test signal T is activated, as is shown in FIGS. 1 to 4.

In analogy to the heretofore known evaluation circuit, the evaluation circuit AS according to the invention is also used per bit of a data input or output interface: $m=8$ parallel data input terminals (in accordance with eight parallel data output terminals) require $m=8$ evaluation circuits AS.

Advantages of this method according to the invention and of the advantageous evaluation circuit AS are:

(a) maintaining the possibility of shortening the test time as in the conventional semiconductor memory, (b) a possibility of checking redundant cells as in conventional semiconductor memories without a parallel testing facility, and with redundant storage cells and conventional test methods, (c) parallel testing is applicable to semiconductor memories both in wafer form as well as in completely assembled modules, (d) no additional module terminals are required but are conceivable, nevertheless, (e) for testing available automatic testers can be used, the addressing capacity of which actually is insufficient for the volume of addresses of the test specimens (the automatic tester, for example, is suited only for semiconductor memories with an addressing volume of 250 Kb: but a one Mb memory is to be tested), but if parallel testing is used, correspondingly fewer addressing signals are required, and (f) reliable testing statements, because every error which occurs is recognized immediately.

The foregoing is a description corresponding in substance to German Application No. P 35 19 941.6, dated Mar. 26, 1985, the International priority of which is being claimed for the instant application, and which is hereby made part of this application. Any material discrepancies between the foregoing specification and the aforementioned corresponding German application are to be resolved in favor of the latter.

We claim:

1. Method of operating a semiconductor memory with a facility for performing integrated parallel testing, wherein the semiconductor memory is subdivided into n identical cell fields each having a plurality of addressable storage cells, each of the storage cells of each of the cell fields being addressable within a storage cycle simultaneously with a respective storage cell of each of the other cell fields, wherein during a testing operation of the semiconductor memory, the storage cell contains test data of one of the n cell fields addressed for the purpose of reading out a stored test datum has, due to a writing-in process, the same stored test datum as each of the other addressed storage cells addressed in the same read cycle in the case ("go" case) wherein the semiconductor memory is in order, which comprises, comparing simultaneously within the semiconductor memory, in the testing operation, within a read cycle, the test data read out from each of the storage cells addressed within the read cycle of the respective n cell fields, with a reference data signal which is identical with the original test data to be stored; and alternatively in a "go" case, making available via the semiconductor memory, a signal with a first waveform at a semiconductor memory terminal; and in a "no-go" case, making available via the semiconductor memory, a signal with a second waveform at the semiconductor terminal, performing the comparison of the read-out test data in an evaluation circuit arrangement within the semiconductor memory, the evaluation circuit having an output, and further applying an output signal of said evaluation circuit to said output; and connecting electronically the output of the evaluation circuit to the semiconductor terminal having the signal with the first and the second waveform, respectively, so that the output signal of the evaluation circuit is the same as the signal with the first and second waveform, respectively.

2. Method according to claim 1, which includes deriving the reference data signal from a signal made available to the semiconductor memory at a terminal contact by an automatic tester.

3. Method according to claim 2, wherein the terminal contact is a data input terminal.

4. Method according to claim 2 which includes using the signal made available by the automatic tester also during read cycles in the testing operation wherein a comparison data signal is stored in a test buffer store; and generating the signal made available by the automatic tester by means of a read signal transmitted from the automatic tester to the semiconductor memory.

5. Method according to claim 2 which includes generating the reference data signal in a test buffer by using a read signal from the signal made available by the automatic tester to the semiconductor memory.

6. Method according to claim 5, wherein the read signal is a signal complementary to a write/read standby signal present in the semiconductor memory.

7. Method according to claim 2, wherein the signal made available by the automatic tester corresponds per read cycle to the test data which is to be stored originally during a write cycle into the semiconductor memory, and is to be read out in the read cycle.

8. Method according to claim 1 wherein the semiconductor memory terminal for the signal which is made available is a data output terminal at which information read out in a read cycle in the normal operation of the semiconductor memory is applied.

9. Method according to claim 1 wherein the reference data signal is used as the signal with the first waveform made available at the semiconductor memory terminal, the reference data signal being identical with the read-out test data and the originally stored test data.

10. Method according to claim 1 wherein the signal with the first waveform made available at the semiconductor memory terminal is a signal with the constant value logical "1".

11. Method according to claim 1 wherein the signal with the first waveform made available at the semiconductor memory terminal is a signal with the constant value logical "0".

12. Method according to claim 1 wherein the signal with the second waveform, is complementary to the signal with the first waveform.

13. Method according to claim 1 which comprises activating the evaluation circuit only in the testing operation by applying an activated test signal.

14. Evaluation circuit for performing a method of operating a semiconductor memory with a capability of integrated parallel testing, comprising a first comparator circuit having n valency circuits each with a first input, a second input and an output, all of said first inputs of said valency circuits being tied together and forming an input for a reference data signal, said second input of each of said valency circuits being connected to a respective one of n data lines, said output of each of said n valency circuits simultaneously forming a respective one of n inputs of a second comparator circuit, said second comparator circuit comprising a device for checking whether all of said n inputs therein have a first logical level, said second comparator circuit having a first output for an error signal (F) which, in a case wherein all of said n inputs thereof have the first logical level, is deactivated, and otherwise is activated, and said second comparator circuit having a second output for signal complementary to said error signal, the evaluation circuit also comprising a result circuit with an output for an output signal of the evaluation circuit which, in a "go" case wherein the semiconductor memory is in order, is available as a signal with a first waveform at a semiconductor terminal and, in a "no-go" case wherein the semiconductor is not in order, assigned with a second waveform is available at the semiconductor terminal, said result circuit comprising, in addition, a first and a second input which are connected to said first and said second outputs of said second comparison circuit, as well as a third input for selection of the waveform of the output signal.

15. Evaluation circuit according to claim 14, wherein each valency circuit is an XNOR gate.

16. Evaluation circuit according to claim 14, wherein each valency circuit is an XOR gate.

17. Evaluation circuit according to claim 14, wherein said second comparator circuit contains a NAND gate with n inputs and one output, said one output being said first output of said second comparator circuit.

18. Evaluation circuit according to claim 14, wherein said second comparator circuit contains an AND gate with n inputs and one output, said one output being said first output of said second comparator circuit (VS2).

19. Evaluation circuit according to claim 14, wherein said second comparator circuit contains an inverter having an input, which is connected to said first output of said second comparator circuit, and having an output which forms said second output of said second comparator circuit.

20. Evaluation circuit according to claim 14, wherein said result circuit comprises two transistors and an inverter, said inverter being connected output-wise to a terminal of a conduction path of one of said transistors; another terminal of said conduction path of said one transistor forming said output of said result circuit, said one transistor being connected gate-wise as said first input of said result circuit to said first output of said second comparator circuit.

21. Evaluation circuit according to claim 20 wherein the other of said transistors of said result circuit has a conduction path by which it is connected to and between said third input of said result circuit and said output of said result circuit, said other transistor being connected gate-wise, as said second input of said result circuit, to said second output of said second comparator circuit.

22. Evaluation circuit according to claim 20 wherein said inverter of said result circuit is connected input-wise to said third input of said result circuit.

23. Evaluation circuit according to claim 14, wherein said third input of said result circuit is connected to a source of said reference data signal.

24. Evaluation circuit according to claim 14, wherein said third input of said result circuit is connected to a fixed potential corresponding to a logical "1".

25. Evaluation circuit according to claim 14, wherein said third input of said result circuit is connected to a fixed potential corresponding to a logical "0".

26. Evaluation circuit according to claim 14, including a test buffer for generating said reference data signal, said test buffer having means for receiving information present at the input side of the test buffer with the aid of an activated read signal during a read cycle within which information is to be read out of the semiconductor memory, and making it available as a reference data signal at the output side of the first comparison circuit and the result circuit.

27. Evaluation circuit according to claim 26, wherein said information present at said input side of said test buffer is a signal which is present at a data input terminal connected to said test buffer and is identical within said read cycle with test data which are to be read out of the semiconductor memory.

28. Evaluation circuit according to claim 26, wherein said read signal is activatable during a read cycle and is derivable by complementation from a read/write standby signal present in the semiconductor memory.

29. Evaluation circuit according to claim 28, wherein a write signal is activatable during a write cycle and is derivable from said write/read standby signal present in the semiconductor memory.

30. Evaluation circuit according to claim 14 wherein said first and said second comparator circuits are activatable only in the testing case by a test signal.

* * * * *